(12) United States Patent
Lim et al.

(10) Patent No.: US 6,369,622 B1
(45) Date of Patent: Apr. 9, 2002

(54) CLOCK DOUBLER CIRCUIT WITH RC-CR PHASE SHIFTER NETWORK

(75) Inventors: Lysander B. Lim, Austin, TX (US); Malcolm Harold Smith, Macungie; H. Scott Fetterman, New Tripoli, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/408,770

(22) Filed: Sep. 29, 1999

(51) Int. Cl.[7] .............................................. H03B 19/00
(52) U.S. Cl. ...................... 327/116; 327/119; 327/122
(58) Field of Search ............................... 327/116, 119, 327/120, 121, 122, 355, 356, 231

(56) References Cited

U.S. PATENT DOCUMENTS

| | | | | |
|---|---|---|---|---|
| 5,281,863 A | * | 1/1994 | Bond et al. ................. | 327/114 |
| 5,703,509 A | * | 12/1997 | Hirate ......................... | 327/119 |
| 5,939,916 A | * | 8/1999 | Jamal et al. ................ | 327/231 |

* cited by examiner

Primary Examiner—Tuan T. Lam
Assistant Examiner—Hiep Nguyen
(74) Attorney, Agent, or Firm—Duane, Morris & Heckscher LLP

(57) ABSTRACT

A phase shifter network receives at an input node an input clock signal which does not contain higher order harmonics and generates first and second phase-shifted clock signals which are 90° apart and which have the same frequency as the input clock signal. First and second voltage comparators receive the first and second phase-shifted clock signals, respectively, and generates first and second squared clock signals, respectively, which are 90° apart and which have the same frequency as the input clock signal. A combiner combines the first and second squared clock signals to produce an output clock signal having twice the frequency of the input clock signal.

20 Claims, 2 Drawing Sheets

100

200

CLOCK DOUBLER CIRCUIT WITH RC-CR PHASE SHIFTER NETWORK

BACKGROUND OF THE INVENTION

1. Field of the Invention

The present invention relates to clock signal sources for use in computer and other electronic systems and, in particular, to clock doubler circuits for doubling the frequency of an input clock signal.

2. Description of the Related Art

Systems employing computer processors often provide one or more clock sources which can be used as a system clock to drive the processor, other components of the system, or the entire system. It is sometimes desired to provide a clock signal having a faster frequency than that of a given clock source available in the system. For example, it may be desired to double the clock signal generated by a given clock source.

Clock doubler circuits are often utilized for this purpose. Both the clock doubler and associated system components may be fabricated as an integrated circuit (IC), within a semiconductor chip. Chips are formed in the substrate of a physical wafer, e.g. a silicon wafer. Typically, several chips are formed in each wafer. A wafer is a very thin, flat disc of a given diameter. The manufacturing process consists of operations on the surface and substrate of the wafer to create a number of chips. Once the wafer is completely processed, it is cut up into the individual chips, the size of which depends on the number of components and complexity of each chip.

One conventional type of clock doubler circuit uses a delay element designed to shift the original clock edges by approximately one quarter cycle. This shifted clock signal is then "multiplied" or combined with the original clock signal with a combiner such as an exclusive-or (XOR) gate to produce a clock signal having twice the frequency of the original clock signal.

Unfortunately, the delays introduced by such delay elements vary over process, temperature, power supply voltage, and the like. This causes the duty cycle of the output clock (i.e., ratio of time spend on versus off, which are ideally equal) to vary greatly with process and temperature, which is undesirable. Compensation circuitry may be employed to ensure that the delay is sufficiently close to a quarter of a clock cycle. However, the compensation circuit or mechanism can itself be complex to design, costly in terms of chip area required, or otherwise undesirable, inefficient, or impractical.

SUMMARY

In the present invention, a phase shifter network receives at an input node an input clock signal which does not contain higher order harmonics and generates first and second phase-shifted clock signals which are 90° apart and which have the same frequency as the input clock signal. First and second voltage comparators receive the first and second phase-shifted clock signals, respectively, and generates first and second squared clock signals, respectively, which are 90° apart and which have the same frequency as the input clock signal. A combiner combines the first and second squared clock signals to produce an output clock signal having twice the frequency of the input clock signal.

DESCRIPTION OF THE PREFERRED EMBODIMENT

The present invention provides an improved clock doubler circuit. The clock doubler of the present invention generates a clock signal at twice the input clock signal frequency, with a very good duty cycle, and without the need for compensation circuitry. As described in further detail, the present invention uses a phase shifter (e.g., an RC-CR network) to generate two phase-shifted signals which are 90° (i.e. a quarter of a clock cycle) apart from each other. In an embodiment, a low-pass filter is placed in front of the RC-CR network to reduce the higher harmonics of square waves in the input clock signal.

The two phase-shifted signals are then passed through voltage comparators to square them up again and combined using an XOR gate to generate an output clock signal having twice the frequency of the input clock signal. A high-pass filter is placed between the low-pass filter and the RC-CR network to block DC so as to level shift the input clock to the appropriate DC level for the voltage comparators. In one embodiment (FIG. 2), an inverter is used to produce the common-mode trigger point. In alternative embodiment (FIG. 3), the clock doubler circuit is self-biasing through use of a low-pass filter around each inverter with the corner well below the frequency of the input clock signal.

Figure 1:
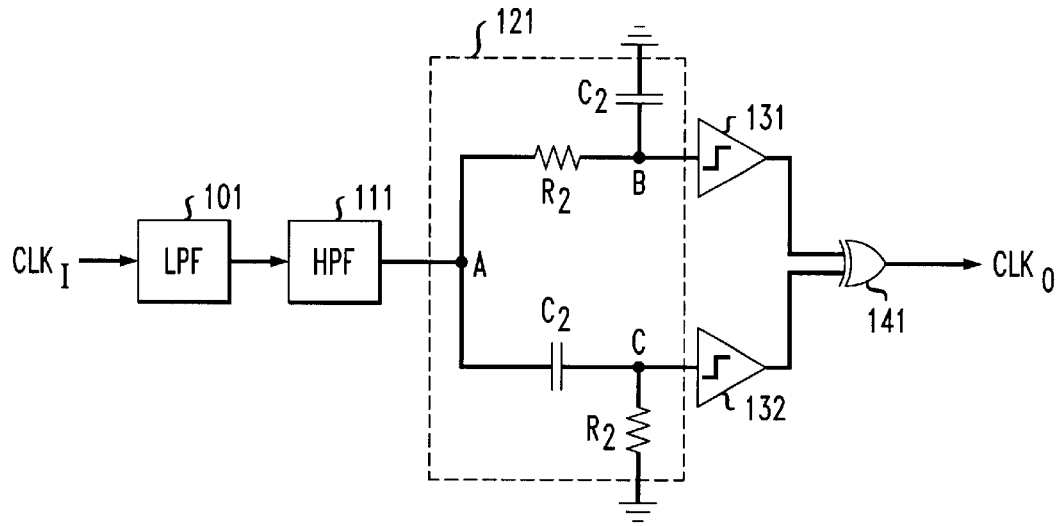
FIG. 1 is a circuit diagram of a clock doubler circuit, in accordance with an embodiment of the present invention.

Referring now to FIG. 1, there is shown a circuit diagram of a clock doubler circuit 100, in accordance with an embodiment of the present invention. Circuit 100 comprises low-pass filter 101; high-pass filter 111; an RC-CR network 121 comprising two CR pairs each having a resistor $R_2$ and capacitor $C_2$; voltage comparators 131, 132; and XOR gate 141. Clock doubler circuit 100 receives input clock signal $CLK_I$, which has an input frequency, and generates an output clock signal $CLK_O$, which has twice the frequency of $CLK_I$. Voltage comparators 131, 132 are preferably limiting amplifiers.

RC-CR phase shifter or splitter network 121 receives a low pass filtered clock signal at node A, and provides at nodes B and C two low pass filtered, phase-shifted signals having the same frequency as the clock signal at node A (and the same frequency as $CLK_I$), which are 90° apart. Unlike previous clock doubler designs which use delay elements, the RC-CR phase shifter network 121 is a robust way to produce two versions of the input clock signal 90° apart, because the 90° difference is maintained over process and temperature variations.

As noted previously, filter 101 removes the higher order harmonics present in input clock signal $CLK_I$. It thus provides to high-pass filter 111 a "rounded" or low pass filtered version of the input clock signal which has the same frequency but fewer higher-order harmonics. The resistors $R_2$ and capacitors $C_2$ preferably have substantially identical resistances and capacitances, respectively, so that the phase difference is as close to 90° as possible. In particular, it is desirable that the RC products of the CR and RC branches of phase shifter network 121 are as close to identical as possible. Very close matching can be achieved by fabricating all these components as part of the same IC, for example, when the entire clock doubler circuit 100 is fabricated on a single chip. Using standard IC fabrication techniques, where the resistors and capacitors are fabricated on the same IC and care is taken in their layout, a match of much better than 1% variation can be achieved between the resistors and capacitors.

Thus, it is possible to achieve component matching so that the two RC products will differ from each other by no more than 1%. Accordingly, in an embodiment, clock doubler circuit 100 and all its components are fabricated within a single ICs. The IC may contain a larger system that 10 itself contains the clock doubler circuit, e.g. the IC may be a device such as a digital signal processor, microcontroller, or microprocessor.

In an embodiment, low-pass filter 101 is employed to reduce higher harmonics of square waves in the input clock signal $CLK_I$. Without low-pass filter 101, the time-domain waveform shapes of the signals at nodes B and C of would be very unequal, causing a sensitivity to transistor mismatch (in the internal circuitry of voltage comparators 131, 132, e.g.) and noise, which would degrade the duty cycle. This is because of the higher order harmonics present in most square-wave type input clock signals. In an alternative embodiment, however, low-pass filter 101 is not utilized. For example, input clock signal $CLK_I$, may be a sinusoidal clock signal which does not contain higher order harmonics. In this case, no low-pass filter is required and the (sinusoidal) input clock signal $CLK_I$, is applied directly to the input node (A) of RC-CR phase shifter network 121, when there is no high-pass filter 111, or directly to the input of the high-pass filter 111 if it is required to decouple the input clock signal.

High-pass filter 111 is used to block DC so as to level shift the input clock to the appropriate DC level for the voltage comparators. Thus, the signal provided at node A is a rounded (low-pass filtered) and DC level-shifted version of the input clock signal $CLK_I$, which has the same frequency as the input clock signal $CLK_I$. Phase shifter network 121 generates, based on this low pass filtered input clock signal at node A, two phase-shifted, rounded or lowpass filtered clock signals at nodes B and C, which are 90° out of phase with respect to each other. In an alternative embodiment, high-pass filter 111 is not utilized. For example, if the mid-point of the clock signal output from low-pass filter 101 is equal to the DC bias levels of the inverters used to form the voltage comparators, then there is no need to use a high-pass filter to decouple the clock input.

Voltage comparators 131, 132 are used to convert these rounded signals at nodes B and C into corresponding 90° phase-shifted square-wave pulses (squared clock signals) at the outputs of comparators 131, 132, by saturating at either high or low depending on whether the input signal is above or below the common-mode trigger point. Thus, XOR gate or combiner 131 provides an output clock signal $CLK_O$ with twice the input clock frequency and having a good duty cycle.

In order to achieve a good duty cycle (i.e., to ensure that 50% of each clock cycle is ON and 50% is OFF), it is important for the comparator threshold to be carefully controlled, i.e. set to be equal to the output common-mode voltage of the phase shifter network 121. A means is therefore required in circuit 100 to ensure that the signals at nodes B and C are properly biased to the DC level suitable for the input to voltage comparators 131, 132. When inverters, for 10 example, are used to implement the voltage comparators or limiters 131, 132, the DC bias for the input clock signals applied to the input of these inverters needs to be set at the trigger voltage ($V_{INV}$) of the inverters to ensure that the inverters are in their high gain region.

Figure 2:
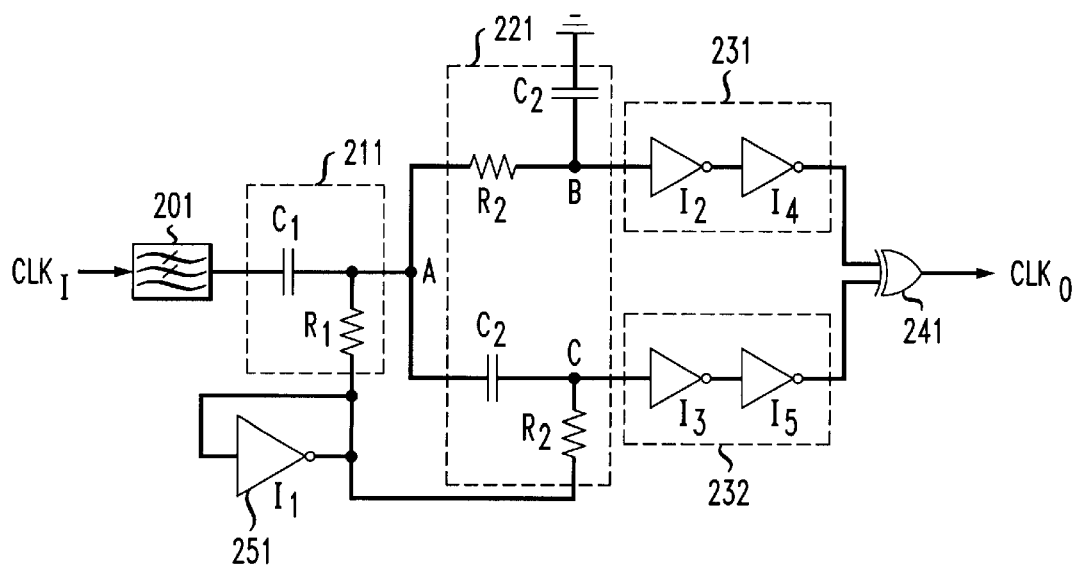
FIG. 2 is a circuit diagram of a clock doubler circuit utilizing an inverter to provide a DC bias, in accordance with an embodiment of the present invention.

In one embodiment, a separate reference inverter is used with its input and output shorted together to provide the DC bias (common-mode trigger point). Referring now to FIG. 2, there is shown circuit diagram of a clock doubler circuit 200 utilizing a reference inverter $I_1$ to provide a DC bias, in accordance with an embodiment of the present invention. Clock doubler circuit 200 is similar to clock doubler circuit 100 except that: two inverters in series are used to implement each voltage comparator 231, 232; a particular CR combination ($C_1$, $R_1$) is used to implement the high-pass filter 211; and an inverter $I_1$, is used as means 251 to provide the common-mode trigger point.

Inverters $I_2$ and $I_4$ constitute voltage comparator or limiter 231 (which corresponds to voltage comparator 131 of circuit 100); and inverters $I_3$ and $I_5$ constitute voltage comparator or limiter 232 (which corresponds to voltage comparator 132 of circuit 100). Any number of inverters may be used in series, from 1 to N, to implement a voltage comparator. If an odd number is used, the phase of the 90° phase-shifted clock signals provided to the input of XOR gate 241 will be each shifted 180° but will still be 90° out of phase with respect to each other.

Thus the only requirement is that voltage comparators 231, 232 both be implemented with either an odd or even number of inverters, as long as both sides have the same number. In circuit 200, two inverters are used to increase the gain to ensure proper saturation, so as to provide a good square wave output clock signal.

High-pass filter 111 is placed between the output of low-pass filter 101 and the input to the phase-shifting RC-CR network 121 to level shift the low-pass-filtered input clock signal to the common-mode voltage generated by inverter $I_1$. The signals at nodes A, B, and C thus swing around a common-mode voltage that is set equal to the threshold of inverter $I_1$. In an embodiment, amplifier inverters $I_2$ and $I_3$ are identical to reference inverter $I_1$ and thus have the same threshold. Thus, the threshold for the comparators 131, 132 is set to the common-mode voltage of the phase shifter network 121 output, which is the midpoint of the swings.

Clock doubler 100 therefore utilizes low-pass filter 101, an RC-CR phase shifter network or circuit 121, and comparators to robustly provide saturated outputs 90° apart, which are then combined with XOR gate 131 to provide the output clock $CLK_O$.

By using the separate bias means 251 provided by inverter $I_1$, circuit 200 provides a way to bias the input inverters $I_2$, $I_3$ of voltage comparators 231, 232, respectively. The present invention therefore provides a clock doubler circuit which, compared to previous clock doublers, is comparatively simple, requires a short design time, and has a smaller die size and negligible power usage and dissipation. However, in order to achieve a good duty cycle, circuit 200 requires there to be good matching between reference inverter $I_1$ and inverters $I_2$, $I_3$ of voltage comparators 231, 232, and also incurs extra current consumption in reference inverter $I_1$.

In an alternative embodiment, the clock doubler circuit is self-biasing through use of a low-pass filter around each inverter with the corner well below the frequency of the input clock signal.

Figure 3:
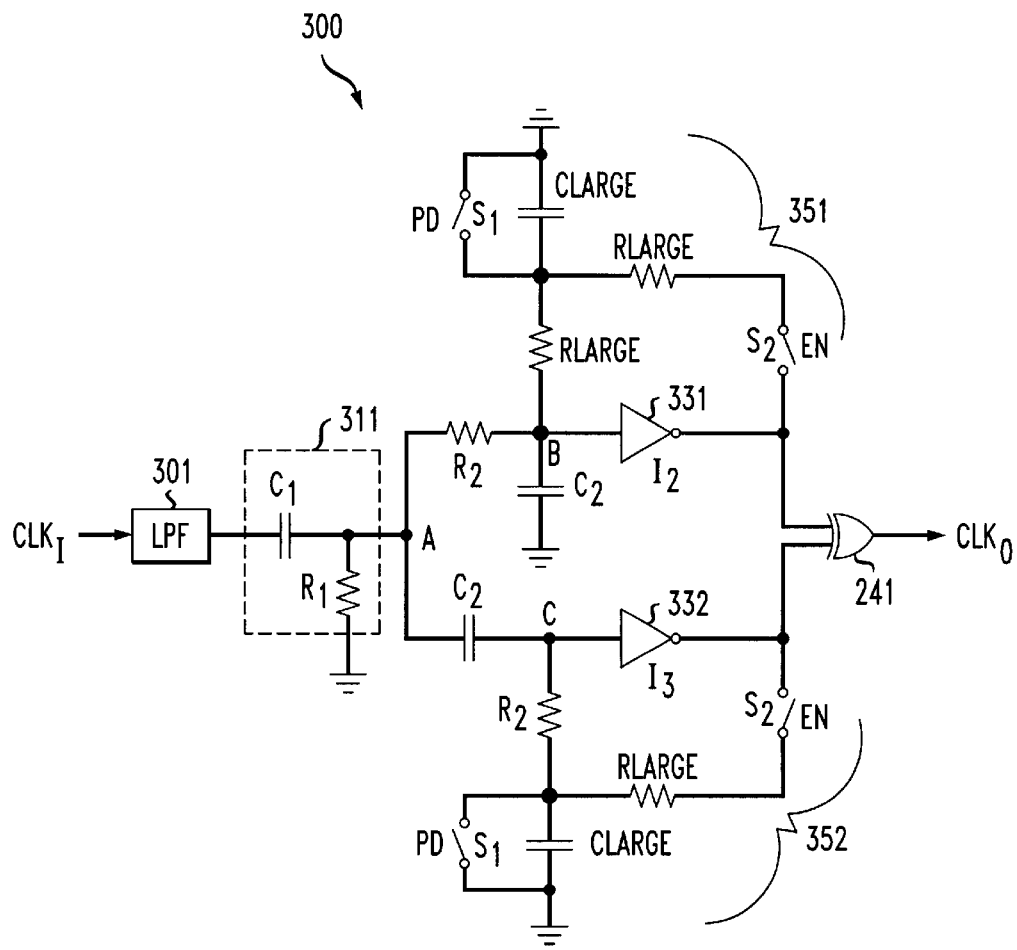
FIG. 3 is a circuit diagram of a self-biasing clock doubler circuit, in accordance with an embodiment of the present invention.

Referring now to FIG. 3, there is shown a circuit diagram of a self-biasing clock doubler circuit 300, in accordance with an embodiment of the present invention. Clock doubler circuit 300 is similar to clock doubler circuit 100 except that:

each voltage comparator 331, 332 is implemented by a single inverter ($I_2$, $I_3$, respectively); a particular CR combination ($C_1$, $R_1$) is used to implement the high-pass filter 311; and self-biasing low-pass filter feedback networks 351, 352.

Thus, instead of requiring a separate bias such as bias means 251 of circuit 200, feedback networks 351, 352 are employed to cause inverters 12, 13 to bias themselves at their trip point. As noted previously, the DC bias for the input clock signals applied to the input of inverters 12, $I_3$ needs to be set at the trigger voltage ($V_{INV}$) of the inverters to ensure that the inverters are in their high gain region. Instead of using a separate reference inverter such as $I_1$ of circuit 200, circuit 300 uses self-biasing.

The high-pass CR structure in one leg of the 90° phase shifter (i.e., the $C_2$, $R_2$ pair at the input to inverter $I_3$) acts as a DC block, so it is not necessary to use the same bias voltages for both inverter amplifiers $I_2$, $I_3$. Each inverter $I_2$, $I_3$ can provide its own bias by shorting its output to its input at DC using a path that blocks interaction at the clock frequency. This is achieved by using a low-pass filter in the shorting path, i.e. low-pass filters 351 and 352. Low-pass filters 351 and 352 have a corner frequency well below the frequency of the input clock signal $CLK_f$, and thus allow DC to pass for biasing purposes. Thus, the DC bias point for the input of each inverter is achieved by way of feedback from the output to the input. The filters also prevent high-frequency feed-forward from the input nodes B and C to the output of inverters $I_2$, $I_3$.

In the embodiment of circuit 300, an odd number of inverters needs to be used to implement the feedback portion of each amplifier 331, 332. As illustrated, a single inverter is used in an embodiment. Additional inverters may be added afterwards if more gain or drive capability is needed. Another reason to use more than one inverter is to load the RC-CR nodes as little as possible, but to be able to drive as much as possible. This may be achieved by making the first or input inverter small (so its input capacitance is small and so it presents less load to the node driving it) and by using increasingly larger inverters until the final inverter is large enough to drive the output.

In one embodiment, power down (PD) switches $S_1$ and enable (EN) switches S2 are used iin paths 351, 352, to ensure that inverters $I_2$, $I_3$ are not conducting in power down mode. Thus, PD and EN signals are used to open and close switches $S_1$, $S_2$, so that switches $S_1$ are open and switches $S_2$ are closed, when circuit 300 is enabled; and the opposite is the case when the circuit is powered down. This helps to reduce power usage or dissipation by inverters $I_2$, $I_3$ during power down mode.

In an alternative embodiment of circuit 300, one resistor may be eliminated by combining resistor $R_1$ with the $R_{LARGE}$ resistor of filter 351 which is coupled to node B. In such an alternative embodiment, resistor $R_1$ is eliminated and the resistor $R_{LARGE}$ is coupled at its bottom terminal to node A instead of to node B.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A clock doubler circuit, comprising:
   (a) a phase shifter network for receiving an input clock signal at an input node and for generating first and second phase-shifted clock signals which are 90° apart and which have the same frequency as the input clock signal, wherein the input clock signal does not contain higher order harmonics;
   (b) first and second voltage limiters for receiving the first and second phase-shifted clock signals, respectively, and for generating first and second squared clock signals, respectively, which are 90° apart and which have the same frequency as the input clock signal, wherein a respective threshold of each of said voltage limiters is approximately equal to an output common-mode voltage of said phase shifter network; and
   (c) a combiner for combining the first and second squared clock signals to produce an output clock signal having twice the frequency of the input clock signal.

2. The clock doubler circuit of claim 1, wherein the phase shifter network is an RC-CR 90° phase shifter network.

3. The clock doubler circuit of claim 2, wherein the RC-CR phase shifter network comprises a first RC pair comprising a first resistor and a first capacitor and a second RC pair comprising a second resistor and a second capacitor, wherein the first and second resistors are matched to have substantially identical resistances and the first and second capacitors are matched to have substantially identical capacitances.

4. The clock doubler circuit of claim 3, wherein the clock doubler circuit is an integrated circuit (IC) in which all of the components of the clock doubler circuit are fabricated in the same IC fabrication process.

5. The clock doubler circuit of claim 1, wherein the combiner comprises an exclusive-or logic gate.

6. The clock doubler circuit of claim 1, further comprising a low pass filter for receiving a squared input clock signal and for removing higher order harmonics in the squared input clock signal to generate the input clock signal which does not contain higher order harmonics.

7. The clock doubler circuit of claim 6, further comprising a high pass filter coupled between the low pass filter and the input node of the phase shifter network to block the DC component of the input clock signal.

8. The clock doubler circuit of claim 7, wherein the first voltage limiter comprises at least one first comparator inverter having a trigger voltage and the second voltage limiter comprises at least one second comparator inverter having the trigger voltage.

9. The clock doubler circuit of claim 8, further comprising a reference inverter having a trigger voltage equal to the trigger voltage of the at least one first and second comparator inverters and said reference inverter having its input and output terminals shorted together and coupled to the phase shifter network to set a DC bias of the first and second phase-shifted clock signals equal to the trigger voltage, wherein said reference inverter is coupled to said high-pass filter and said phase shifter network.

10. The clock doubler circuit of claim 8, further comprising first and second bias feedback path low pass filters coupled between the output and input of the at least one first and second comparator inverters, respectively, wherein the first and second bias feedback path low pass filters have a corner frequency below the frequency of the input clock signal to provide a DC path so that the first and second comparator inverters are self-biasing, whereby a DC bias of the first and second phase-shifted clock signals is set equal to the trigger voltage.

11. The clock doubler circuit of claim 10, wherein each bias feedback path low pass filter comprises a pair of switches which prevent the respective comparator inverter from conducting when the circuit is powered off.

12. The clock doubler circuit of claim 1, wherein each voltage limiter comprises a comparatively small first inverter coupled in series with at least one subsequent comparatively large inverter.

13. The clock doubler circuit of claim 1, further comprising:
   a low pass filter for receiving a squared input clock signal and for removing higher order harmonics in the squared input clock signal to generate the input clock signal which does not contain higher order harmonics; and
   a high pass filter coupled between the low pass filter and the input node of the phase shifter network to block the DC component of the input clock signal, wherein:
      the phase shifter network is an RC-CR 90° phase shifter network; and
      the combiner comprises an exclusive-or logic gate.

14. The clock doubler circuit of claim 1, wherein the input clock signal is a sinusoidal signal.

15. The clock doubler circuit of claim 1, wherein clock switch controller is fabricated as part of an integrated circuit.

16. The clock doubler circuit of claim 15, wherein integrated circuit is one of a digital signal processor, a microcontroller, and a microprocessor.

17. An integrated circuit having a clock doubler circuit, the clock doubler circuit comprising:
   (a) a phase shifter network for receiving an input clock signal at an input node and for generating first and second phase-shifted clock signals which are 90° apart and which have the same frequency as the input clock signal, wherein the input clock signal does not contain higher order harmonics;
   (b) first and second voltage limiters for receiving the first and second phase-shifted clock signals, respectively, and for generating first and second squared clock signals, respectively, which are 90° apart and which have the same frequency as the input clock signal, wherein a respective threshold of each of said voltage limiters is approximately equal to an output common-mode voltage of said phase shifter network; and
   (c) a combiner for combining the first and second squared clock signals to produce an output clock signal having twice the frequency of the input clock signal.

18. The integrated circuit of claim 17, wherein the phase shifter network is an RC-CR 90° phase shifter network.

19. The integrated circuit of claim 18, wherein integrated circuit is one of a digital signal processor, a microcontroller, and a microprocessor.

20. An integrated circuit having a clock doubler circuit, the clock doubler circuit comprising:
   (a) a low pass filter for receiving a squared input clock signal and for removing higher order harmonics in the squared input clock signal to generate an input clock signal which does not contain higher order harmonics;
   (b) a high pass filter coupled to the low pass filter to block the DC component of the input clock signal;
   (c) an RC-CR 90° phase shifter network for receiving the input clock signal at an input node coupled to the high pass filter and for generating first and second phase-shifted clock signals which are 90° apart and which have the same frequency as the input clock signal, wherein the input clock signal does not contain higher order harmonics, wherein the RC-CR phase shifter network comprises a first RC pair comprising a first resistor and a first capacitor and a second RC pair comprising a second resistor and a second capacitor, wherein the first and second resistors are matched to have substantially identical resistances and the first and second capacitors are matched to have substantially identical capacitances;
   (d) first and second voltage limiters for receiving the first and second phase-shifted clock signals, respectively, and for generating first and second squared clock signals, respectively, which are 90° apart and which have the same frequency as the input clock signal, wherein the first voltage limiter comprises at least one first comparator inverter having a trigger voltage and the second voltage limiter comprises at least one second comparator inverter having the trigger voltage;
   (e) a combiner comprising an exclusive-or logic gate for combining the first and second squared clock signals to produce an output clock signal having twice the frequency of the input clock signal; and
   (f) first and second bias feedback path low pass filters coupled between the output and input of the at least one first and second comparator inverters, respectively, wherein the first and second bias feedback path low pass filters have a corner frequency below the frequency of the input clock signal to provide a DC path so that the first and second comparator inverters are self-biasing, whereby a DC bias of the first and second phase-shifted clock signals is set equal to the trigger voltage, wherein each bias feedback path low pass filter comprises a pair of switches which prevent the respective comparator inverter from conducting when the circuit is powered off.

* * * * *